United States Patent
Shimazaki

(10) Patent No.: US 6,731,092 B2
(45) Date of Patent: May 4, 2004

(54) APPARATUS AND METHOD FOR INITIALIZING STEPPER MOTOR

(75) Inventor: Hiroyuki Shimazaki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 93 days.

(21) Appl. No.: 09/964,599

(22) Filed: Sep. 28, 2001

(65) Prior Publication Data

US 2002/0039011 A1 Apr. 4, 2002

(30) Foreign Application Priority Data

Sep. 29, 2000  (JP) ........................................ 2000-299181

(51) Int. Cl.⁷ ............................. G05B 19/40; H02P 8/00; G01P 3/46
(52) U.S. Cl. ........................ 318/685; 318/696; 318/37; 318/54; 318/65; 318/119; 318/739; 324/164; 324/154 R; 361/239
(58) Field of Search ................................ 318/685, 686, 318/696, 490, 286, 463, 464, 37, 54, 65, 85, 119, 739, 280, 281; 324/160, 164, 171, 154 R, 167, 151 R, 146, 144, 151 A; 361/236, 239

(56) References Cited

U.S. PATENT DOCUMENTS

| | | | |
|---|---|---|---|
| 4,291,268 A | * | 9/1981 | Okuyama ................ 324/154 R |
| 4,553,093 A | * | 11/1985 | Chikasue ................ 324/154 R |
| 5,287,050 A | * | 2/1994 | Kronenberg et al. ........ 318/696 |
| 5,665,897 A | | 9/1997 | Lippmann et al. ............ 73/1.01 |
| 5,783,939 A | | 7/1998 | Lippmann et al. ...... 324/154 R |
| 5,847,531 A | * | 12/1998 | Hoffsommer et al. ....... 318/696 |
| 5,877,694 A | * | 3/1999 | Kataoka ..................... 318/696 |
| 5,942,872 A | * | 8/1999 | Steger et al. ................ 318/696 |
| 6,014,075 A | * | 1/2000 | Fujimori et al. ............ 340/461 |
| 6,034,501 A | * | 3/2000 | Sato et al. .................. 318/696 |
| 6,356,046 B1 | * | 3/2002 | Koumura et al. ........... 318/696 |

FOREIGN PATENT DOCUMENTS

| | | |
|---|---|---|
| DE | 197 37 725 | 3/1999 |
| EP | 0 756 175 | 1/1997 |
| JP | 06022596 A * | 1/1994 ............. H02P/8/00 |

OTHER PUBLICATIONS

Copy of European Patent Office Communication dated Feb. 15, 2002 including European Search Report for corresponding European Patent Application No. 01123505.

* cited by examiner

Primary Examiner—Robert Nappi
Assistant Examiner—Edgardo San Martin
(74) Attorney, Agent, or Firm—Armstrong, Kratz, Quintos, Hanson & Brooks, LLP

(57) ABSTRACT

A stepper motor is initialized so that the exciting signal is applied to coils with the step shifted by half of one electric cycle from the rebounding step being synchronized with the timing when the stopper piece is brought into contact with a fixed stopper. The rebounding step, in which the rotor of the stepper motor reverses its rotating direction, can be easily detected. If the rebounding step can be detected, the position for initializing can be easily defined in the angle shifting manner as described above.

8 Claims, 4 Drawing Sheets

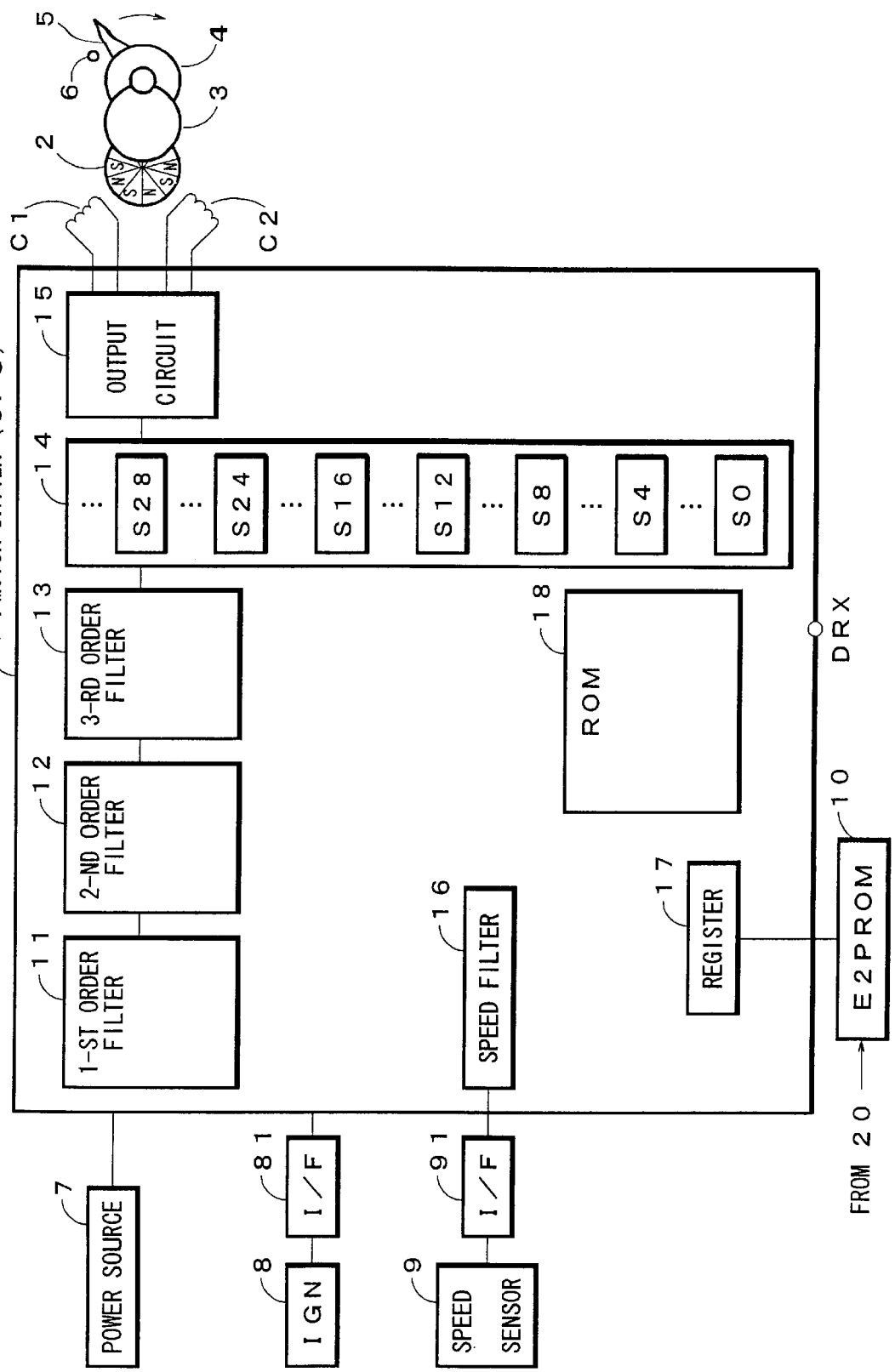

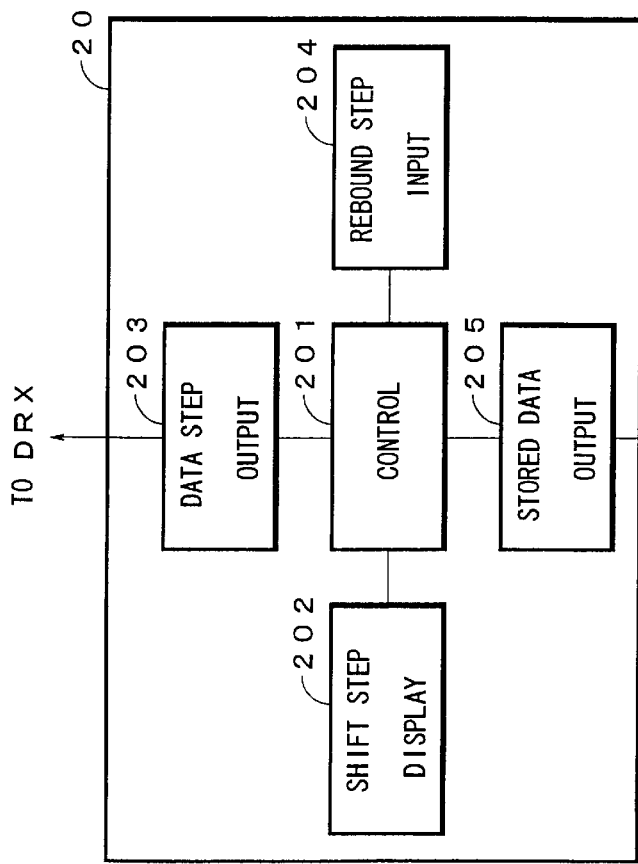

F I G. 4 A
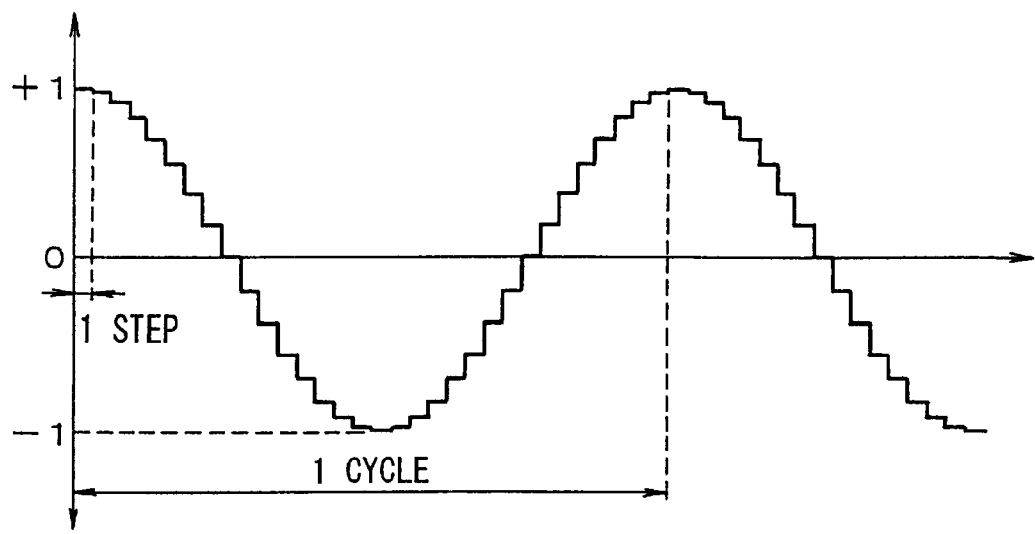
F I G. 4 B
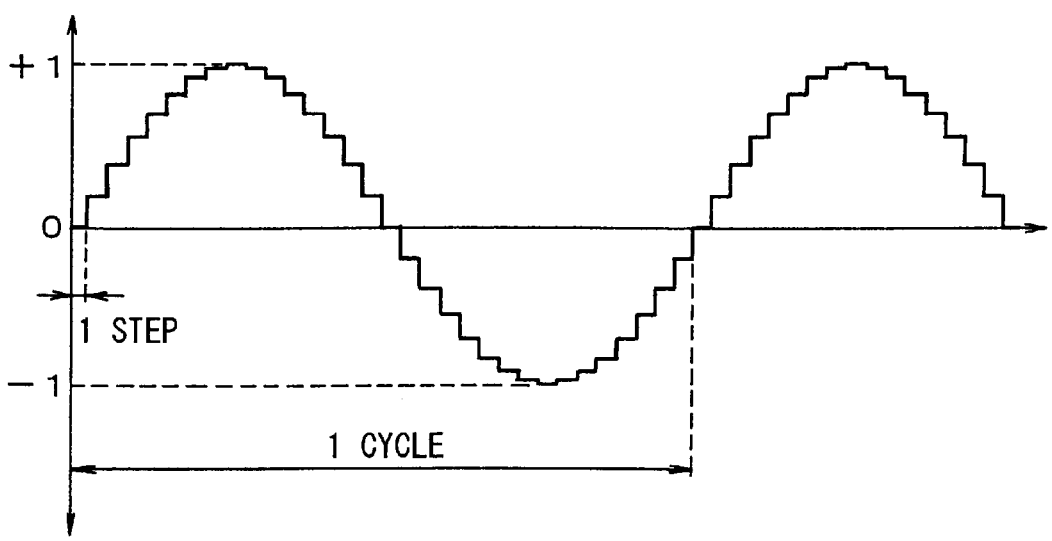

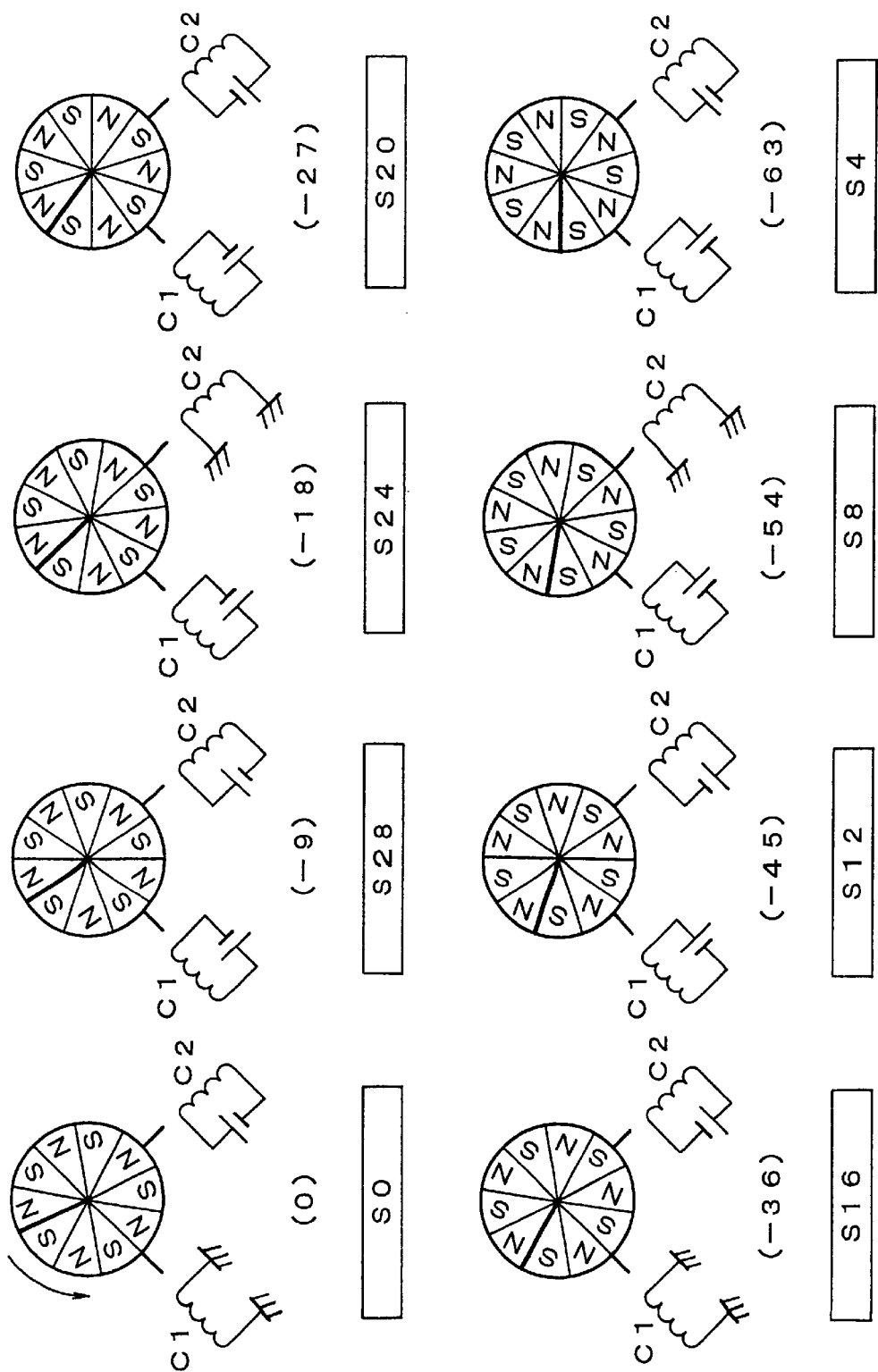

APPARATUS AND METHOD FOR INITIALIZING STEPPER MOTOR

BACKGROUND OF THE INVENTION

1. Field of the Invention

The present invention relates to an apparatus and method for initializing a stepper motor, and more particularly to an apparatus and method for initializing a stepper motor for synchronizing a timing when a stopper piece linked with a rotor of the stepper motor is brought into contact with a fixed stopper with a reference step in an exciting signal for driving the stepper motor.

2. Description of the Related Art

In an in-vehiclemeter such as a speedmeter for indicating a vehicle speed, a tachometer for indicating an engine speed, etc., in recent years, a stepper motor has been used in order to satisfy the demand of response and indicating accuracy. However, in order to make an accurate indication using the stepper motor, initial synchronization must be previously acquired between the timing when a stopper piece interlocked with the rotation of the stepper motor is brought into contact with a fixed stopper and a reference step in an exciting signal for driving the stepper motor.

Generally, the above initial synchronization has been acquired in a step of assembling the in-vehicle meter. Traditionally, with a stopper piece (or pointer) linked with the rotor being pressed so that the stopper piece is in contact with the fixed stopper, the above reference step has been synchronized with the rotating pattern of the rotor at this time. Otherwise, the initializing has been carried out taking the amount of backlash into consideration.

However, the above traditional method presents a problem in that an index which is a guideline for initializing is not clear, the initializing is not stable under the influence of the material of the pointer, gear and other components of a motor and a play of the gear, and a long time is taken for the initializing.

SUMMARY OF THE INVENTION

An object of this invention is to provide an apparatus and method for initializing a stepper motor which can clarify an index of initializing by a digit to facilitate the initializing and shorten the time taken for the initializing.

In accordance with a first aspect of this invention, there is provided an apparatus for initializing a stepper motor comprising:

means for supplying an exciting signal to a coil for rotating a rotor of the stepper motor so as to shift a stopper piece linked with the rotor in a first rotating direction toward a zero point defined by a fixed stopper, the exciting signal having a single electric cycle composed of a plurality of exciting steps;

means for inputting a rebounding step number which is the exciting step when the rotor reverses its rotating direction from the first rotating direction from a second direction opposite thereto;

means for computing a shift step number shifted by the number of exciting steps which corresponds to a half of the single electric cycle from the rebounding step number; and means for initializing the stepper motor so as to apply the exciting signal to the coil with the shift step number being synchronized with a timing when the stopper piece is brought into contact with the fixed stopper.

In this configuration, the index which is a guide line for initializing is clarified so that the initializing can be performed easily and surely. Therefore, in the process of motor assembling, the time for initializing can be greatly shortened, thus realizing the initializing with great accuracy.

Preferably, the means for initializing the stepper motor comprises means for storing data in a storage means connected to a motor driver for driving the stepper motor.

In this configuration, the time for initializing can be further shortened.

Preferably, the means for initializing the stepper motor comprises means for displaying the shift step number.

In this configuration, because the shift step number is displayed, it can be used to recognize the quality of the product during a motor assembling process. For example, it can be used to inspect whether or not the initialization has been completed appropriately.

Preferably, the apparatus for initializing a stepper motor comprises:

a plurality of stepper motors; and means for aligning shift step numbers computed so as to correspond to the stepper motors on the corresponding data holding positions allotted to the storage means.

In this configuration, the shift step numbers corresponding to the stepper motors are aligned so as to the corresponding data storing positions allotted in the storage means. Therefore, the data can be simultaneously stored so that the time taken for initializing when the plurality of stepper motors are used, particularly the time taken for data storing can be shortened.

Preferably, the rotor is composed of five pairs of magnetic poles magnetized alternately and uniformly with an N-pole and an S-pole; and the exciting signal is composed of 32 exciting steps which are created on the basis of a sine wave and uniformly allotted.

In this configuration, the rotor control can be made smoothly.

In accordance with the second aspect of this invention, there is provided a method for initializing a stepper motor comprising:

a first step of supplying an exciting signal to a coil for rotating a rotor of the stepper motor so as to shift a stopper piece linked with the rotor in a first rotating direction toward a zero point defined by a fixed stopper, the exciting signal having a single electric cycle composed of a plurality of exciting steps;

a second step of inputting a rebounding step number which is the exciting step when the rotor reverses its rotating direction from the first rotating direction from a second direction opposite thereto;

a third step of computing a shift step number shifted by the number of exciting steps which corresponds to a half of the single electric cycle from the rebounding step number; and a fourth step of initializing the stepper motor so as to apply the exciting signal to the coil with the shift step number being synchronized with a timing when the stopper piece is brought into contact with the fixed stopper.

In this method, the index which is a guide line for initializing is clarified so that the initializing can be performed easily and surely. Therefore, in the process of motor assembling, the time for initializing can be greatly shortened, thus realizing the initializing with great accuracy.

In the above method, preferably, the fourth step comprises:

storing data in a storage means connected to a motor driver for driving the stepper motor.

In this method, the time for initializing can be further shortened.

Preferably, the above method further comprises a fifth step of displaying the shift step number.

In this method, since the shift step number is displayed, it can be used to recognize the quality of the product during a motor assembling process. For example, it can be used to inspect whether or not the initialization has been completed appropriately.

The above and other objects and features of the invention will be more apparent from the following description taken in conjunction with the accompanying drawings.

BRIEF DESCRIPTION OF THE DRAWINGS

FIG. 1 is a schematic view of the entire arrangement to which this invention is applied;

FIGS. 2A and 2B are block diagrams showing an embodiment of this invention;

FIGS. 3A and 3B are views for explaining examples of data which are created during data processing in the embodiment according to this invention;

FIGS. 4A and 4B are waveform charts showing the exciting signal used in the embodiment of this invention; and FIG. 5 is a view showing the relationship between an exciting step used in the embodiment of this invention and a rotating pattern of a rotor.

DESCRIPTION OF THE PREFERRED EMBODIMENTS

Now referring to the drawings, an explanation will be given of an embodiment of this invention.

FIG. 1 schematically shows the entire arrangement of a device to which this invention is applied.

Referring to FIG. 1, a motor driver 1 for driving a stepper motor supplies an exciting signal for rotary-driving a rotor 2 to driving coils C1 and C2. The exciting signal, as described later, is composed of 32 exciting steps which are generally created on the basis of SIN and COS waveforms and uniformly allotted. The motor driver 1 is constructed to include a CPU for executing filtering and data conversion (described later) which is a basic function of the motor driver 1. Therefore, the motor driver 1 will be also referred to as a driver CPU or simply CPU.

The rotor 2 which is rotary-driven by the driving coils C1 and C2 arranged to form an angle of 90° between them has five pairs of magnetic poles magnetized alternately and uniformly with an N-pole and an S-pole. The rotor 2 is coupled with an intermediate gear 3 and an output gear 4. The output gear 4 is provided with an pointer or stopper piece 5.

The pointer or stopper piece 5 rotates in interlock with the rotation of the rotor 2 according to an exciting signal with a zero point defined by a fixed stopper 6, thereby indicating a prescribed scale (not shown). For example, during acceleration, the pointer or stopper piece 5 rotates clockwise, as indicated by the arrow. Inversely, during deceleration or "return-to-zero", the stopper piece 5 rotates counterclockwise in a direction reverse to the direction of the arrow.

The motor driver 1 is connected to an ignition switch 8 (IGN 8) and a speed sensor 9 through an I/F 81 and I/F 91, respectively. In response to the on/off of the IGN 8, the motor driver 1 creates an exciting signal for returning the pointer or stopper piece 5 to the zero point and supplies it to the coils C1 and C2. Further, in response to an sensor output (speed pulse) corresponding to a vehicle speed sent out from the speed sensor 9, the motor driver 1 also creates an exciting signal for shifting the pointer or stopper piece 5 by the distance corresponding to the vehicle speed, and supplies it to the coils C1 and C2.

Further, the motor driver 1 is supplied with the power source 7 from an in-vehicle battery. At the timing when the power source 7 turns on, the motor driver 1 may create the exciting signal for returning the pointer or stopper piece 5 to the zero point and supplies it to the coils C1 and C2.

Further, the motor driver 1 is connected to a E2PROM 10. The E2PROM 10, which is a rewritable storage means, stores the data representative of the relationship between the timing when the pointer or stopper piece 5 is brought into contact with the fixed stopper 6 and the reference step of the exciting signal described later. The E2PROM 10 can electrically rewrite the stored data with the aid of a storing device such as an initializing device described later.

Further, the motor driver 1 has a connecting terminal DRX to be connected to the initializing device described later. In response to the exciting signal or command signal composed of data steps for initializing which has been received from the initializing device, the motor driver 1 supplies the exciting signal to the coils C1 and C2.

Incidentally, in this example, although the motor driver 1 controls a single set of motor elements or components (reference numerals C1, C2, 2, 3, 4, 5 and 6) corresponding to the speed meter, it can control a tachometer, fuel meter, thermometer, etc. through time division control.

The motor driver 1 includes a first-order filter 11, a second-order filter 12, a third-order filter 13, an SIN/COS table 14, a speed filter 16, a register 17 and an ROM 18. The motor driver 1 is basically constructed of a CPU to create an exciting signal for driving the stepper motor.

The first-order filter 11 serves to control the maximum rotational speed of the motor so that a pointer control signal is subjected to filtering in addition/subtraction of a prescribed value corresponding to a change in the pointer control signal (or angular data). The second-order filter 12 serves to execute the weighted averaging for the filtering processing result of the first-order filter 11 at prescribed time intervals, thereby smoothing an amount of data change. The third-order filter 13 serves to execute the weighted averaging processing for the filtering processing result in the second-order filter 12 at prescribed time intervals so that the stepper motor is not stepped out, thereafter providing the processing result to the SIN/COS table 14.

Reference symbols S0, S4, S8, S12, S16, S20, S24 and S28 described on the SIN/COS table 14 denote step numbers for every four steps of 32 steps constituting the exciting signal. Further, some steps are present between the steps at every four steps. For example, between S0 and S4, S2 and S3 are present. However, for simplicity of illustration, these steps S2 and S3 are not shown. The rotating pattern of the rotor 2 corresponding to each step will be explained with reference to FIG. 5.

The SIN/COS table 14 receives the filtering processing result from the third-order filter 13 to create the SIN/COS data corresponding to the exciting signal. On the basis of the SIN/COS data from the SIN/COS table 14, in order to rotate the rotor 2, the output circuit 15 produces the exciting signal to be supplied to the coils C1 and C2 as a prescribed voltage.

The speed filter 16 converts the speed pulse supplied from the speed sensor 9 into the corresponding angular data to be supplied to the first-order filter 11. The register 17 temporarily stores the stable position data of the motor transferred from the E2PROM during the process of creating the exciting signal. The ROM 18 stores the data necessary for the processing by CPU such as a target angular data of the exciting signal to be created in the processing of return to zero.

Referring to FIG. 2, an explanation will be given of an embodiment of this invention. FIGS. 2A and 2B are block diagrams showing the embodiment of this invention. Specifically, FIG. 2A is a schematic block diagram of an initializing device 20. FIG. 2B is a view showing an example of a display in FIG. 2A.

As seen from FIG. 2A, the initializing device 20 includes a control unit 201, a shift step display unit 202, a data step output unit 203, a rebounding step input unit 204 and a stored data output unit 205.

The control unit 201 supplies an exciting signal to the motor driver 11 through the data step output unit 203 connected to the connecting terminal DRX of the motor driver 1. It should be noted that the exciting signal forms a single electric cycle composed of 32 cycles for shifting the pointer or stopper piece 5 linked with the rotor 2 of the stepper motor toward the zero point defined by the fixed stopper 6. The data step output unit 203 includes a connecting terminal to the E2PROM 10, a connecting wire, an interface, etc. The function of the control unit 201 and data step output unit 203 correspond to means for supplying an exciting signal and a first step.

The exciting signal may be created using the filters, data table and output circuit included in the motor driver 1 while the control unit 201 sends a command signal to the motor driver 1 through the data step output unit 203.

Although not shown, a switch for instructing the exciting signal or command signal to be sent out is connected to the control unit 201.

The rebounding step input unit 204 corresponds to a rebounding step input means (and second step) and serves to input the step number (rebounding step number) when the rotating direction of the rotor is reversed from the direction toward the zero point to the opposite direction. The rebounding step can be acquired as the step number from the exciting signal supplying means using a push switch in such a manner that the push switch is pushed when rebounding of the pointer linked with the rotor is visually recognized.

The control unit 201 also includes a shift step computing means (and third step). The shift step computing means computes the shift step number shifted from the rebounding step number supplied from the rebounding step input unit by the number of excited steps corresponding to the half cycle (the number of excited steps corresponding to 180° with the single cycle being 360°), and supplies the shift step number to the shift step display unit 202. The ground for the shift value will be explained with reference to FIG. 5.

The shift step display unit 202 displays the shift step number received from the shift step computing means of the control unit 201. The shift step display unit 202 displays it using an LED. An example of the display is shown in FIG. 2B. The example shown in FIG. 2B indicates that the value (shift step number) displaced by 180° in the single electric cycle when the rebounding step number is supplied to the rebounding step input unit 204 is the exciting step 16. The shift step display unit 202 corresponds to the shift step display unit and fifth step defined in Claims.

Thus, because the shift step number is displayed, the stepper motor can be surely initialized while the written data is recognized. Further, because the shift step number is displayed, it can be used to recognize the quality of the product during a motor assembling process. For example, it can be used to inspect whether or not the initialization has been completed appropriately.

The stored data output unit 205 includes a terminal to be connected to the data storing terminal of the E2PROM 10, a connecting wire, an interface, etc. so that the data based on the above shift step number computed by the shift step computing means is written into the E2PROM 10 connected to the motor driver 1 under the control by the control unit 201. Further, a switch (not shown) is connected to the control unit 201.

On the basis of the data stored in the E2PROM 10, the motor driver 1 applies the exciting signal to the coils C1 and C2 with the reference step being synchronized with the timing when the stopper piece 5 is brought into contact with the fixed stopper 6. The above function of the control unit 201 and the written data output unit 205 correspond to the initializing means and fourth step.

By writing the computed data in the E2PROM connected to the motor driver 1 as described above, the initializing time can be shortened in a motor assembling step.

Referring to FIG. 3, an explanation will be given of the data created in the process of data processing executed by the control unit 201.

FIG. 3A shows the displayed data which are the shift step numbers corresponding to the data step numbers when the step numbers represented by the data steps as shown are sent to the motor driver 1. As described above, the single electric cycle is composed of 32 exciting steps allotted uniformly so that the displayed data corresponding to the data step 0 is 16 which is out of phase by 180° in the single electric cycle. Likewise, the data steps 28, 24, 20, 16, 12, 8 and 4 correspond to the displayed data 12, 8, 4, 0, 28, 24 and 20. For example, in the assembling step, when the pointer rebounds at the data step 0, the displayed data is 16. Therefore, it can be known that the reference step of the motor is 16.

In this example, although the data is created every four steps, it may be created every two steps or every single step.

As described above, where the motor driver 1 controls a tachometer (THCHO), fuel meter (TANK) and thermometer (TEMP) as well as the speed meter (SPEED), the reference step data corresponding to the respective meters are stored. The E2PROM 10 stores the data in the order of SPEED, THCHO, TANK and TEMP.

The control unit 201 aligns the shift step numbers computed so as to correspond to a plurality of stepper motors for the respective meters in their stored order in the E2PROM 10. The shift step numbers corresponding to the stepper motors are aligned so as to the corresponding data storing positions allotted in the storage means. Therefore, the data can be simultaneously stored so that the time taken for initializing when the plurality of stepper motors are used, particularly the time taken for storing can be shortened.

The function of the control unit 201 described herein corresponds to the aligning means.

Finally, referring to FIGS. 4 and 5, an explanation will be given of examples of waveforms of the exciting signal used in this embodiment, a relationship between the exciting step and the rotating pattern of the rotor and ground for the shift value.

In the illustrated example, it is assumed that the rotor is composed of five pairs of N and S poles magnetized alternately, and the exciting signal is composed of 32 exciting steps allotted uniformly. In this way, the rotor control can be made to be smooth.

FIGS. 4A and 4B illustrate examples of the exciting signals supplied to the coils C1 and C2 shown in FIG. 1.

The two-phase exciting signals supplied to the coils C1 and C2 are based on the two-phase sinusoidal waves which are out of phase by 90° from each other. As seen from FIGS. 4A and 4B, the two-phase exciting signals with the single electric cycle (or simply referred to single cycle) composed of 32 exciting steps are produced from the motor driver 1 and supplied to the coils C1 and C2. The exciting signal with the phase shown in FIG. 4A or 4B applied to the coil C1 or C2 is determined taking the arrangement of the coils C1 and C2 for the rotor 2, rotating direction, etc. into consideration.

FIG. 5 is a view showing the relationship between the exciting step used in the embodiment of this invention and the rotary pattern of the rotor. In the illustrated example, it is assumed that the rotor rotates gradually in a direction of arrow during the normal return to zero (while the pointer or stopper piece returns toward the zero point).

For simplicity of illustration, FIG. 5 shows only the rotary patterns of the rotor corresponding to the step numbers every four steps of the 32 steps constituting the exciting signal. Reference numbers S0, S28, S24, S20, S16, S12, S8 and S4 encircled by rectangles, respectively denote step numbers every four steps. Actually, the one cycle of the exciting signal is composed of 32 steps of S0, S31, S30, S29, S28, S27, S26, S25, S24, S23, S22, S21, S20, S19, S18, S17, S16, S15, S14, S13, S12, S11, S10, S9, S8, S7, S6, S5, S4, S3, S2 and S1, which are uniformed allotted. Therefore, between S0 and S28, S31, S30 and S29 are present. This applies to between the other steps as shown.

Because the return to zero is premised in this example, the step numbers are illustrated in a descending power series.

Likewise, the rotor has the rotating patterns which shift in the angle between the eight rotating patterns illustrated in FIG. 5, i.e., the rotating patterns corresponding to 32 steps from S0 to S1. The numerals indicated in parentheses denote rotating angles of the rotor corresponding to the above respective steps. In this example, it is assumed that the rotor rotates clockwise in a normal rotation, and during the return to zero, the rotor rotates counterclockwise as indicated by arrow. Therefore, the numeral in the parenthesis is marked with minus (−).

In the case of the stepper motor having no defect, in the rotating pattern of the rotor illustrated by S0, the pointer or fixed stopper 6 linked with the rotor as shown in FIG. 1 is brought into contact with the fixed stopper 6. Such a step of S0 corresponds to the above reference step.

As the exciting signal applied to the coils for driving the rotor shifts in the sequence of S0, S28, S24, . . . , in the normal operation, the rotor rotates by 9° during four steps as illustrated. As described above, actually, the one cycle of the exciting signal is composed of 32 steps so that S31, S30 and S29 are present between S0 and S28. This applies to between the other steps as illustrated. Therefore, while the rotor gradually takes the rotating patterns between the rotating patterns as illustrated, it exhibits the rotating patterns every four steps as illustrated.

With the rotor having 10 poles and the gear ratio of 36:1, the output gear 2 rotates by 2° within in one cycle. Because one cycle is composed of 32 equal steps, the output gear 2 rotates by 0.0625° for one step.

Now it is assumed that the COS values of the two-phase waveforms which constitute the exciting signals applied to the coils in step S0 are 1 and 0 and assumed that the pointer or stopper piece is in contact with the fixed stopper 6 in interlock with the rotating pattern of the rotor at this time. In this case, if the exciting signal is applied in the sequence of S0, . . . S28, . . . S24, after the contact has been made, the rotor cannot rotate in the direction of arrow because the pointer or stopper piece 5 is kept in contact with the fixed stopper, but when the exciting signal reaches S16 shifted by a half electric cycle from the reference step, the rotor starts to rotate in a direction reverse to the arrow.

Specifically, in this embodiment, using the phenomenon that the step shifted by the half electric cycle (180°) from the step when the rotor reverses its rotating direction is the reference step, or the rotor reverses its rotating direction in the step shifted by the half electric cycle from the reference step, initializing of the stepper motor is done with the aid of synchronization taken between the rotating pattern of the rotor when the pointer or stopper piece 5 is brought into the fixed stopper and the reference step of the exciting signal applied at this time.

As described above, in accordance with this embodiment, the initializing for the stepper motor is done so that the exciting signal is applied to the coils with the step shifted by the half cycle of the one electric cycle from the rebounding step being synchronized with the timing when the stopper piece is brought into contact with the fixed stopper. The rebounding step, in which the rotor of the stepper motor reverses its rotating, can be easily detected. If the rebounding step can be detected, the position for initializing can be easily defined in the angle shifting manner as described above. Thus, the index which is a guide line for initializing is clarified so that the initializing can be performed easily and surely. Accordingly, in the process of motor assembling, the time for initializing can be greatly shortened, thus realizing the initializing of the stepper motor with great accuracy.

The rotating direction of the rotor during the return-to-zero should not be limited to the direction described in this embodiment. The pole arrangement of the coils C1 and C2 and position of the fixed stopper can be changed. For example, the position determined by the stopper which appears only when the zero point is detected can be set as the zero point.

What is claimed is:

1. An apparatus for initializing a stepper motor comprising:
    means for supplying an exciting signal to a coil for rotating a rotor of the stepper motor so as to shift a stopper piece linked with the rotor in a first rotating direction toward a zero point defined by a fixed stopper, the exciting signal having a single electric cycle composed of a plurality of exciting steps;
    means for inputting a rebounding step number which is the exciting step when the rotor reverses its rotating direction from the first rotating direction to a second direction opposite thereto;
    means for computing a shift step number shifted by the number of exciting steps which corresponds to half of the single electric cycle from the rebounding step number; and
    means for initializing the stepper motor so as to apply the exciting signal to the coil with the shift step number being synchronized with a timing when the stopper piece is brought into contact with the fixed stopper.

2. An apparatus for initializing a stepper motor according to claim 1, wherein the means for initializing the stepper motor comprises means for storing data in a storage means connected to a motor driver for driving the stepper motor.

3. An apparatus for initializing a stepper motor according to claim 2, wherein the means for initializing the stepper motor comprises means for displaying the shift step number.

4. An apparatus for initializing a stepper motor according to claim 3 comprising:

a plurality of stepper motors; and means for aligning shift step numbers computed so as to correspond to the stepper motors to the corresponding data holding positions allotted to the storage means.

5. An apparatus for initializing a stepper motor according to claim 1, wherein the rotor is composed of five pairs of magnetic poles magnetized alternately and uniformly with an N-pole and an S-pole; and the exciting signal is composed of 32 exciting steps which are created on the basis of a sine wave and uniformly allotted.

6. A method for initializing a stepper motor comprising:

a first step of supplying an exciting signal to a coil for rotating a rotor of the stepper motor so as to shift a stopper piece linked with the rotor in a first rotating direction toward a zero point defined by a fixed stopper, the exciting signal having a single electric cycle composed of a plurality of exciting steps;

a second step of inputting a rebounding step number which is the exciting step when the rotor reverses its rotating direction from the first rotating direction to a second direction opposite thereto;

a third step of computing a shift step number shifted by the number of exciting steps which correspond to a half of the single electric cycle from the rebounding step number; and a fourth step of initializing the stepper motor so as to apply the exciting signal to the coil with the shift step number being synchronized with a timing when the stopper piece is brought into contact with the fixed stopper.

7. A method initializing a stepper motor according to claim 6, wherein the fourth step comprises:

storing data in a storage means connected to a motor driver for driving the stepper motor.

8. A method for initializing a stepper motor according to claim 6, further comprising a fifth step of displaying the shift step number.

* * * * *